United States Patent
Kanai et al.

(10) Patent No.: US 7,809,455 B2
(45) Date of Patent: Oct. 5, 2010

(54) METHOD OF CORRECTING DIE MODEL DATA

(75) Inventors: Yoshio Kanai, Tochigi (JP); Koji Hara, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 252 days.

(21) Appl. No.: 11/972,460

(22) Filed: Jan. 10, 2008

(65) Prior Publication Data
US 2008/0215174 A1 Sep. 4, 2008

(30) Foreign Application Priority Data
Jan. 17, 2007 (JP) .................... 2007-007706

(51) Int. Cl.
G06F 19/00 (2006.01)
G06F 9/45 (2006.01)
G06K 9/00 (2006.01)

(52) U.S. Cl. ................... 700/98; 703/22; 700/159; 700/160; 700/163; 382/154

(58) Field of Classification Search ............ 700/98, 700/165, 160, 163, 187, 159; 382/154; 703/22
See application file for complete search history.

(56) References Cited

U.S. PATENT DOCUMENTS

| | | | | |
|---|---|---|---|---|
| 3,370,492 A | * | 2/1968 | Treff | 83/76.7 |
| 3,857,025 A | * | 12/1974 | English et al. | 700/160 |
| 4,469,930 A | * | 9/1984 | Takahashi | 219/121.72 |
| 4,916,990 A | * | 4/1990 | Dolansky et al. | 83/34 |
| 4,979,224 A | | 12/1990 | Maiocco et al. | |
| 5,019,993 A | * | 5/1991 | Montalcini et al. | 700/187 |
| 5,278,948 A | * | 1/1994 | Luken, Jr. | 345/423 |
| 5,627,771 A | * | 5/1997 | Makino | 702/155 |
| 5,917,726 A | * | 6/1999 | Pryor | 700/95 |
| 6,163,734 A | * | 12/2000 | Shigefuji et al. | 700/160 |
| 6,279,425 B1 | * | 8/2001 | Cicotte | 76/107.1 |
| 6,604,015 B2 | * | 8/2003 | Iriguchi et al. | 700/187 |
| 6,675,061 B2 | * | 1/2004 | Hirai et al. | 700/189 |
| 6,871,109 B2 | * | 3/2005 | Yamada et al. | 700/98 |
| 6,898,560 B1 | * | 5/2005 | Das | 703/7 |
| 7,162,075 B2 | * | 1/2007 | Littlefield et al. | 382/154 |
| 7,417,635 B2 | * | 8/2008 | Rockwood et al. | 345/419 |
| 7,447,616 B2 | * | 11/2008 | Wang et al. | 703/8 |
| 2001/0021880 A1 | * | 9/2001 | Kato et al. | 700/160 |
| 2004/0085311 A1 | * | 5/2004 | Lee et al. | 345/419 |

FOREIGN PATENT DOCUMENTS

| | | |
|---|---|---|
| JP | 04-213704 A | 8/1992 |
| JP | 2005-199567 A | 7/2005 |
| JP | 2006-234473 A | 9/2006 |

\* cited by examiner

*Primary Examiner*—Albert DeCady
*Assistant Examiner*—Thomas H Stevens
(74) *Attorney, Agent, or Firm*—Arent Fox LLP

(57) ABSTRACT

A die is produced based on die model data. The produced die is corrected. The corrected die is three-dimensionally measured by a measuring tool to produce measured three-dimensional die data. A polygonal surface represented by the measured three-dimensional die data and a model surface represented by the die model data are compared with each other. The polygonal surface is brought into proximity to the model surface, and the absolute values of the distances between a plurality of pairs of measuring points on the polygonal surface and corresponding points on the model surface are calculated. The die model data are corrected based on the absolute values of the distances.

5 Claims, 15 Drawing Sheets

METHOD OF CORRECTING DIE MODEL DATA

BACKGROUND OF THE INVENTION

1. Field of the Invention

The present invention relates to a method of efficiently correcting die model data that have been generated on a CAD system into more accurate die model data.

2. Description of the Related Art

It has heretofore been customary to produce a press die by designing a die from the shape data of a formed article using a CAD system or the like to generate die data, then creating a numerical control (NC) program for machining a press die based on the die data, and machining a press die in a first stage on a numerically controlled (NC) machine tool which is operated by running the NC program. Since the machined press die in the first stage may not necessarily be able to produce formed articles of desired quality, it has been the general practice to check the press die based on formed articles that have actually be produced by the press die on a trial basis and correct the press die according to the results of the check.

For example, it has been proposed in the art to automatically correct die data produced using a CAD system by comparing the die data and measured dimensions of a formed article with each other, determining dimensional discrepancies caused by springback, shrinkage, etc., and correcting measured die dimensions using the dimensional discrepancies (see, for example, Japanese Laid-Open Patent Publication No. 2005-199567).

In order to make subsequent die corrections unnecessary, it has also been proposed to generate die model data, fabricate a full-size die model of synthetic resin according to the die model data, correct the die model, and then correct the die model data, after which an actual die is manufactured based on the corrected die model data (see, for example, Japanese Laid-Open Patent Publication No. 04-213704).

There has further been proposed a method of recognizing the deviation of the formed surface of a formed article from the forming surface of a die and the direction in which the deviation occurs, by measuring three-dimensional shapes and coordinate positions of the formed surface of the formed article placed on the die and article targets secured to the formed article, and comparing the three-dimensional shape of the die and the three-dimensional shape of the formed article with each other using the coordinate positions of die targets secured to the die and the coordinate positions of the article targets secured to the formed article (see, for example, Japanese Laid-Open Patent Publication No. 2006-234473).

Dies, such as upper and lower dies, for pressing articles of complex shapes, such as automobiles, tend to develop clearances between the mating surfaces thereof which cannot be predicted from prototype articles and pressing simulations, and the prototype articles are liable to suffer wrinkles and cracks. Therefore, it is necessary to repeat a process of correcting the dies and producing prototype articles again.

Since a group of die measuring points are corrected and thereafter corrected die data are regenerated based on the corrected group of die measuring points, it takes a long period of time to produce die data. When a repetitive die (second die) is to be produced, the die data are used as feedback data to generate die model data for the repetitive die. Therefore, the repetitive die can be designed in a relatively short period of time. Repetitive dies are produced, for example, to manufacture doors for one side of automobiles which are symmetrical to doors for the other side of automobiles after the die for the doors for the other side of automobiles has been produced, and also to manufacture identical products at a plurality of production sites.

For further shortening the time required to produce repetitive dies, the three-dimensional shape of a corrected die may be measured and the produced three-dimensional data may be reflected in die model data for the repetitive dies.

However, it is not easy to reflect the three-dimensional data in the die model data for the repetitive dies. According to a method of generating a polygonal model from a group of die measuring points and generating surfaces based on the polygonal model, it would not be possible to obtain CAD data that keep surfaces neatly joined to each other, are faithful to the die measuring points, and represent smooth surfaces. Specifically, as die surfaces contain small marks caused by a numerically controlled (NC) machining process, CAD data representing smooth surfaces may not be produced if measured die dimensions are directly reflected in die model data.

If data representative of surfaces are simply compared to each other for correcting positional deviations, then corresponding points that are defined in order to correct an area having a small radius of curvature or an area having a small shape tend to be in twisted association with each other.

SUMMARY OF THE INVENTION

It is an object of the present invention to provide a method of correcting die model data based on differential values between corresponding points on surfaces, the values which can easily be determined without the need for a complex process such as simulations, for producing a repetitive die accurately in a short period of time.

According to the present invention, a method of correcting die model data comprises a first step of producing die model data based on a formed article model with a computer, a second step of producing a die based on the die model data, a third step of correcting the die, a fourth step of measuring the corrected die with a measuring tool to produce measured three-dimensional die data, and a fifth step of comparing the measured three-dimensional die data with the die model data with a computer, bringing a first surface represented by the measured three-dimensional die data into proximity to a second surface represented by the die model data, calculating absolute values of distances between a plurality of pairs of measuring points on the first surface and corresponding points on the second surface, and correcting the die model data based on the absolute values of the distances.

As described above, the measured three-dimensional die data and the die model data are compared with each other, and the absolute values of the distances between a plurality of pairs of measuring points on the first surface and corresponding points on the second surface, the first and second surfaces being established closely to each other. Thereafter, the die model data are corrected based on the absolute values of the distances. Therefore, the differences between the measuring points on the first surface and the corresponding points on the second surface can easily be determined. The die model data can be corrected by the differences to produce a repetitive die highly accurately within a short period of time.

The die model data can be corrected simply without the need for complex processes such as simulations, and the man-hours required to produce the repetitive die can be reduced.

The fifth step may comprise a first auxiliary step of calculating points of intersection between the die model data and average normal vectors to a plurality of surfaces having the measuring points of the measured three-dimensional die data, a second auxiliary step of dividing straight lines extending from the measuring points to the points of intersection at a predetermined ratio, thereby establishing dividing points, and a third auxiliary step of calculating points of intersection between the die model data and normal vectors from the dividing points to the die model data, wherein the second auxiliary step and the third auxiliary step may be carried out at least once, thereby defining the measuring points of the measured three-dimensional die data and the corresponding points of the die model data. Owing thereto, the relationship between the measuring points and the corresponding points is prevented from being twisted in correcting regions where the radius of curvature is small and regions where small shapes are involved.

The second auxiliary step may comprise establishing polygons based on the dividing points, determining point representative vectors based on normal vectors to the polygons which are present in a predetermined range from the dividing points, and moving corresponding dividing points based on the point representative vectors. Owing thereto, the corresponding points can thus be established on the second surface while substantially keeping their positional relationship to the measuring points on the first surface, so that the corresponding points and the measuring points are appropriately associated with each other.

In this case, the point representative vectors may be determined by weighting, depending on distances, the normal vectors to the polygons which are present in the predetermined range from the dividing points and averaging the weighted normal vectors.

The first surface may be corrected into a smooth surface by interconnecting central points of surfaces of polygons provided by the measuring points.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

A method of correcting die model data according to an embodiment of the present invention will be described below with reference to FIGS. 1 through 15.

Figure 1:
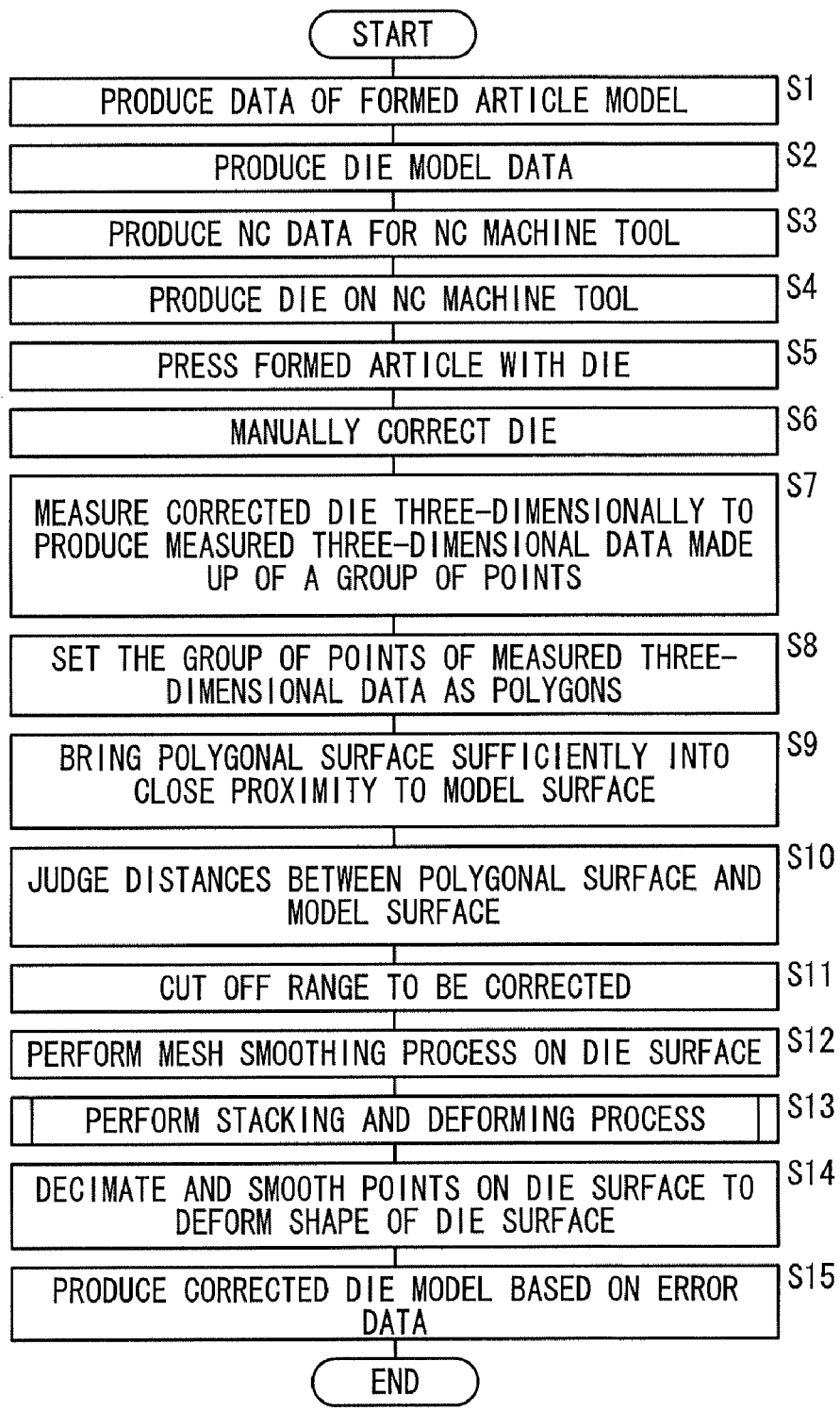
FIG. 1 is a flowchart of a method of correcting die model data according to an embodiment of the present invention.

In step S1 shown in FIG. 1, a formed article to be obtained is designed, and data of a formed article model are generated.

In step S2, data of a die model are generated on a CAD system based on the data of the formed article model.

In step S3, NC data for controlling an NC machine tool are generated based on the die model data.

In step S4, a die is produced by the numerically controlled machine tool based on the NC data.

In step S5, a formed article as a prototype article is pressed using the produced die.

In step S6, the prototype article and a forming surface of the die are observed and analyzed, and the die is manually corrected. Specifically, the prototype article is observed and analyzed for wrinkles, cracks, dimensional errors, etc., and the die is observed and analyzed for pressing surface conditions, etc. The die is manually corrected on the basis of a general evaluation of the prototype article and the die.

In step S7, the shape of the corrected die is three-dimensionally measured by a three-dimension digitizer or the like, thereby producing three-dimensional measured data made up of a group of points.

In step S8, the group of points of the three-dimensional measured data are set as a number of polygons by a predetermined means using a computer. These polygons represent the surface shape of the die that has been measured. Each of the polygons is primarily represented by a triangular plane.

In step S9, the computer compares the three-dimensional measured data converted into the polygons and the die model data with each other, and brings a polygonal surface (first surface) represented by the polygons based on the three-dimensional measured data into close proximity with a model surface (second surface) represented by the die model data. For example, the polygonal surface may be sufficiently brought in its entirety into close proximity with the model surface such that the average distance between the polygonal surface and the model surface becomes substantially minimum. The polygonal surface and the model surface may partially cross each other.

In step S10, the distances between the polygonal surface and the model surface are judged at a plurality of corrective points. Specifically, the distances between the polygonal surface and the model surface may be approximately judged at reference points, i.e., only those corrective points, rather than all of a number of points making up the polygonal surface.

In step S11, errors between the polygonal surface and the model surface at the reference points are approximately judged, and a range to be corrected is cut off. The range to be corrected may be determined automatically according to given judgment standards or may be determined by the operator. The range to be corrected may be part of the polygonal surface and the model surface, may be a surface made up of a plurality of areas of the polygonal surface and the model surface, or may be the polygonal surface and the model surface in their entirety.

In step S12, a mesh smoothing process is performed on a basic polygonal surface 100 represented by the polygons.

Figure 2:
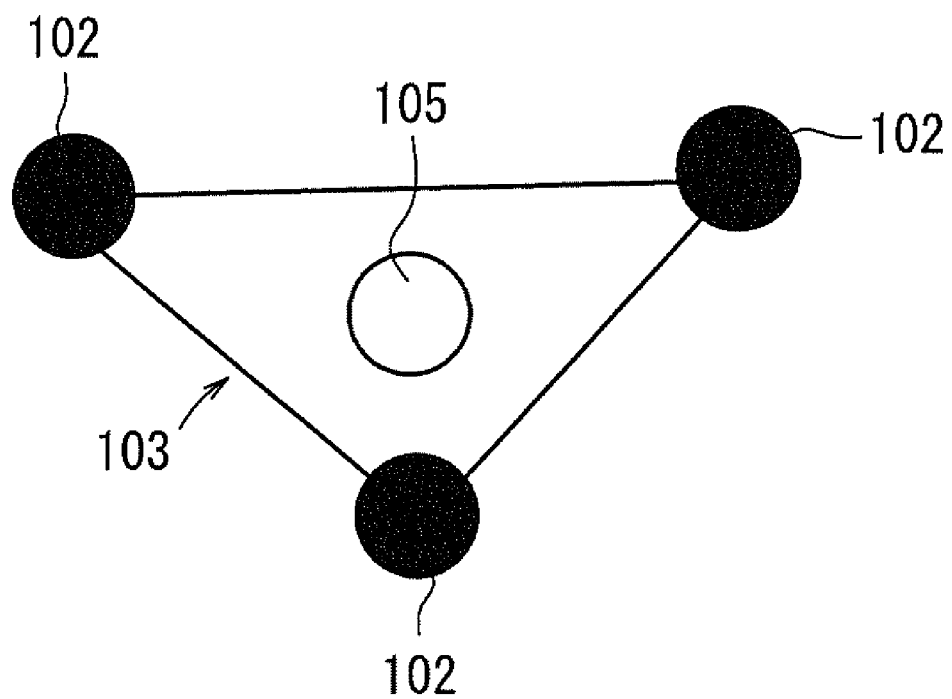
FIG. 2 is a diagram showing the positional relationship between mesh vertices and a central point.
Figure 3:
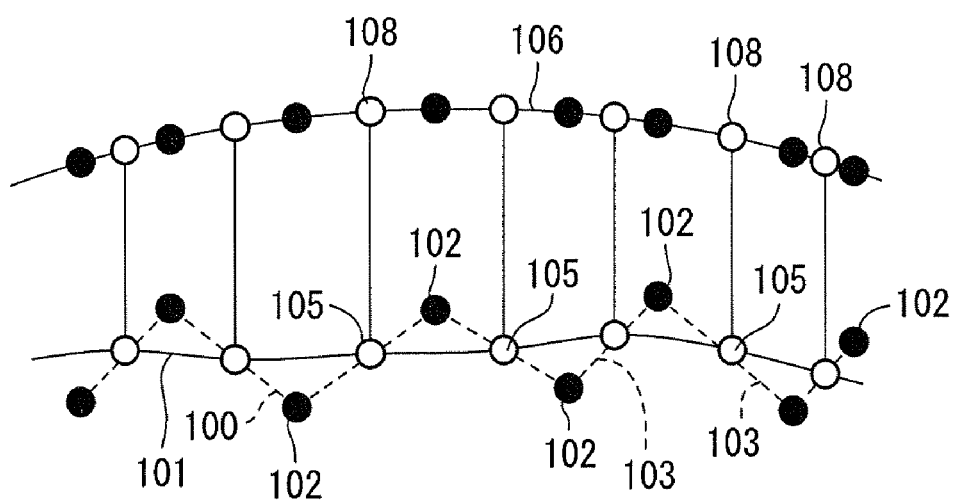
FIG. 3 is a diagram showing a mesh smoothing process.

According to the mesh smoothing process, as shown in FIGS. 2 and 3, a central point (e.g., a center of gravity) 105 is determined in a triangular polygon 103 which is defined by measuring points 102 of the polygonal surface 101, and a corrected polygonal surface 101 is generated as a smooth surface interconnecting central points 105. The mesh smoothing process thus performed allows a subsequent relaxation process to be stably carried out.

In step S13, a stacking and deforming process is performed. The stacking and deforming process will be described later.

In step S14, based on the results of the stacking and deforming process, points on the polygonal surface 101 are decimated (for accuracy management) and smoothed to deform the shape of the polygonal surface 101. According to the process in step S14, the correspondence between measuring points of the three-dimensional measured data of the die and the die model data is defined, and polygonal data of a group of actual measuring points are constructed on the surface of the die model which is paired with the measuring points of the three-dimensional measured data of the die.

In step S15, the die model is deformed to produce a corrected die model based on the absolute values of the distances from the measuring points of the three-dimensional measured data of the die, which are determined in step S14, to the die model, i.e., the data of the errors. Since the die model data are modified based on the data of the errors according to the process in step S15, die model data are generated which take over adjacency information and curves of the original data. Consequently, even if there are some missing measuring points, die model data are generated based on shapes around those missing measuring points.

The modified die model thus produced reflects a considerable amount of information about the shape of the die that is corrected in step S6 based on the prototype article that has actually been produced at least once. Therefore, the man-hours required to correct the die model for producing a repetitive die are greatly reduced. In other words, NC data are generated based on the modified die model, and a repetitive die which is produced by an NC machine tool based on the NC data reflects the shape of the die that is corrected in step S6. Consequently, the repetitive die thus produced does not need to be essentially corrected, and hence highly accurate articles can be manufactured by the repetitive die.

The stacking and deforming process in step S13 will be described below. The stacking and deforming process is so called because intermediate surfaces in three layers are stacked and modified with respect to the original polygonal surface 101.

Figure 4:
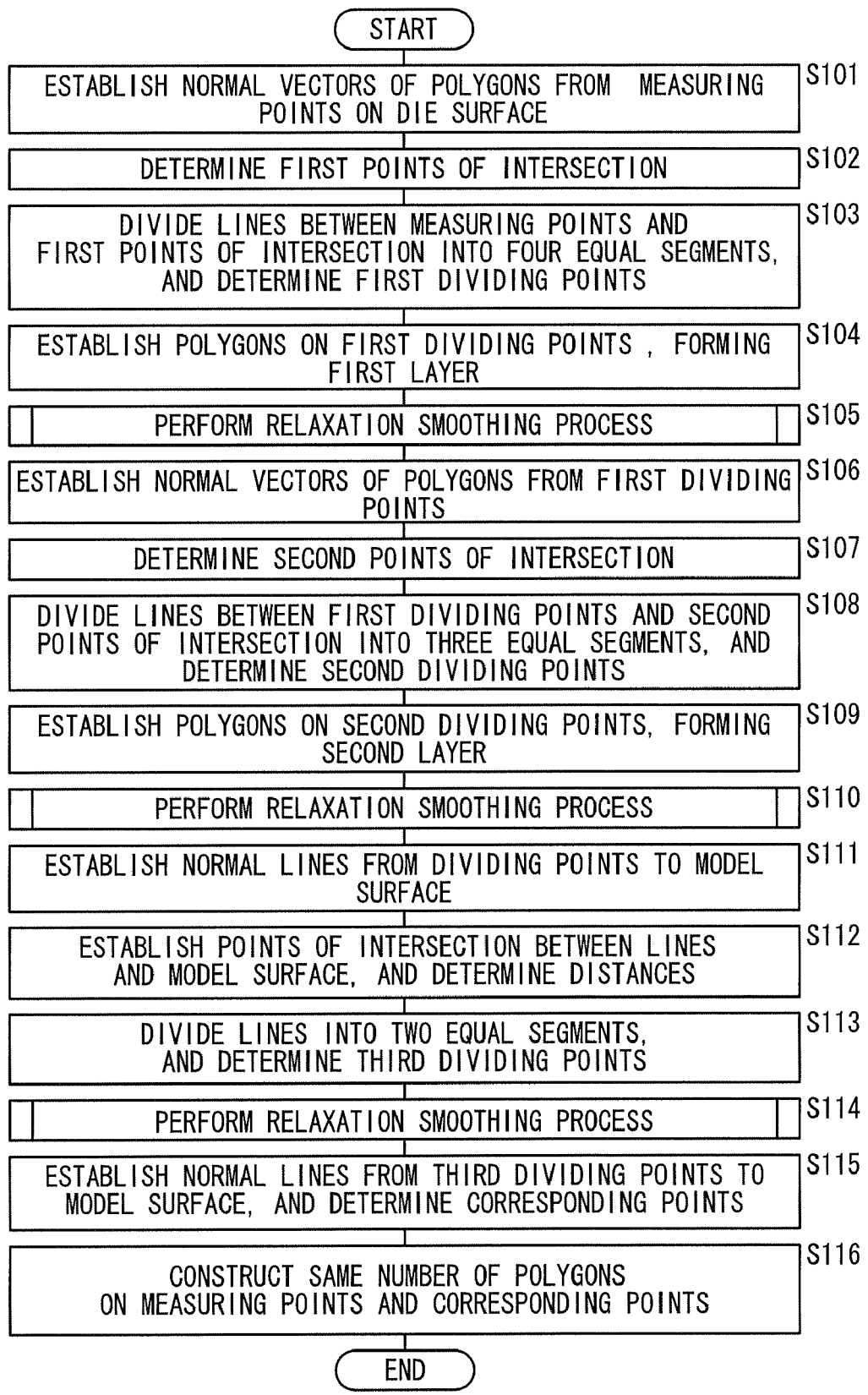
FIG. 4 is a flowchart of a processing sequence of a stacking and deforming process.
Figure 5:
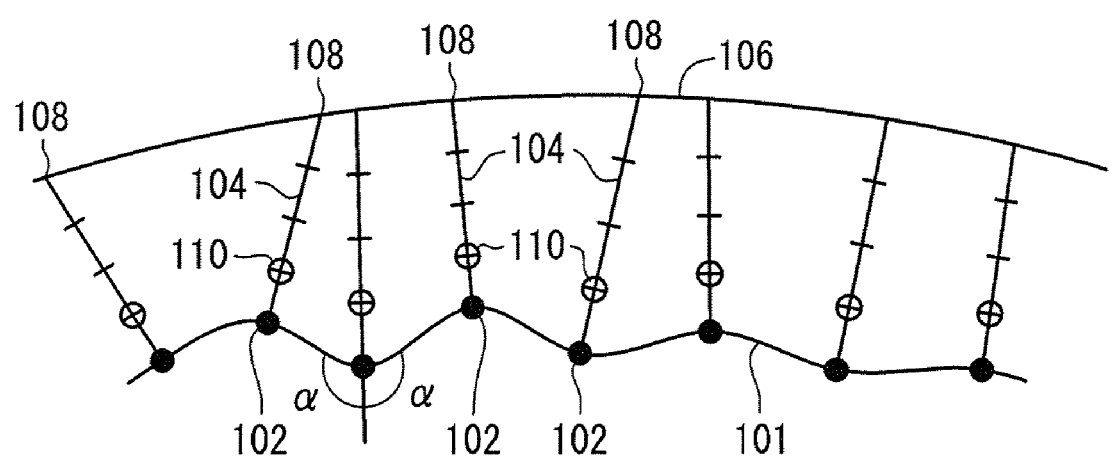
FIG. 5 is a diagram showing the manner in which lines are established from a polygonal surface to a model surface.

In step S101 shown in FIG. 4, lines 104 are established as normal vectors to the polygonal surface 101 from the respective measuring points 102 on the polygonal surface 101, as shown in FIG. 5. Specifically, the lines 104 as normal vectors are established such that angles α between the lines 104 and adjacent segments of the polygonal surface 101 are equal to each other.

In step S102, first points 108 of intersection between the lines 104 and the model surface 106 are determined, and distances from the measuring points 102 to the first intersecting points 108 are determined.

In step S103, each of the lines 104 between the measuring point 102 and the first intersecting point 108 is divided into four equal segments, for example, and a first dividing point 110 which is closest to the measuring point 102 is determined on each of the lines 104. Stated otherwise, the first dividing point 110 is a point produced when the line 104 is divided at a ratio of 1:3 between the measuring point 102 and the first intersecting point 108. Each of the lines 104 from the measuring point 102 to the first intersecting point 108 may be divided into at least two equal segments.

Figure 6:
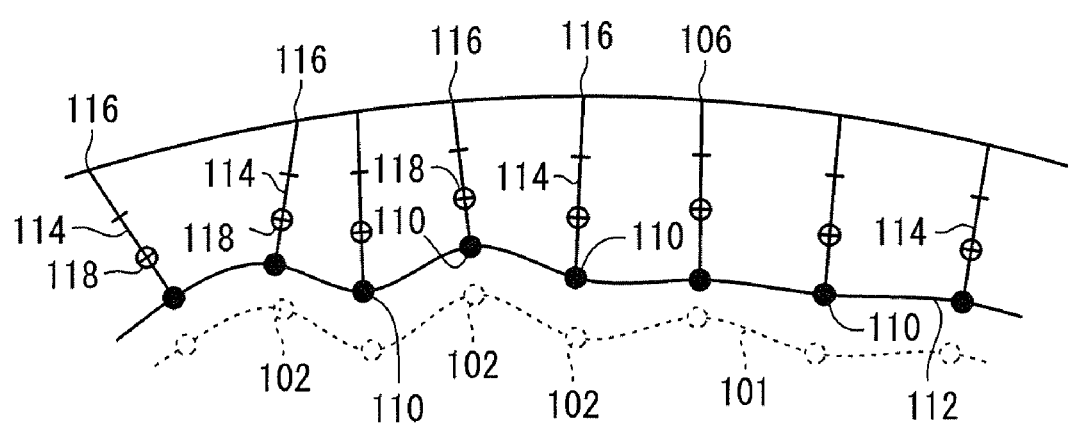
FIG. 6 is a diagram showing the manner in which lines are established from a first layer surface to the model surface.

In step S104, while the polygons remain connected based on the original measuring points 102, other polygons are established on the corresponding first dividing points 110 on the respective lines 104, providing a first layer 112 represented by those polygons, as shown in FIG. 6.

In step S105, a relaxation smoothing process is performed on the polygons of the first layer 112. The relaxation smoothing process is a process in which the first dividing points 110 are moved in a predetermined range such that the triangular shapes of the polygons of the polygonal surface 101 and the triangular shapes of the corresponding polygons of the first layer 112 remain similar to each other or approximated to each other in a considerably appropriate extent. Details of the relaxation smoothing process will be described later.

In step S106, lines 114 are established from the respective first dividing points 110 to the model surface 106, as with step S101.

In step S107, second points 116 of intersection between the lines 114 and the model surface 106 are determined, and distances from the first dividing points 110 to the second intersecting points 116 are determined, as with step S102.

In step S108, each of the lines 114 between the first dividing point 110 and the second intersecting point 116 is divided into three equal segments, and a second dividing point 118 which is closest to the first dividing point 110 is determined on each of the lines 114. Stated otherwise, the second dividing point 118 is a point produced when the line 114 divided at a ratio of 1:2 between the first dividing point 110 and the second intersecting point 116.

In step S109, while the polygons remain connected based on the original measuring points 102, other polygons are established on the second dividing points 118 on the respective lines 114, providing a second layer (not shown) represented by those polygons.

In step S110, a relaxation smoothing process is performed on the polygons of the second layer such that the triangular shapes of the polygons of the first layer 112 and the second layer remain similar to each other or approximated to each other in a considerably appropriate extent.

Thereafter, though not shown, lines are established from the respective second dividing points 118 to the model surface 106 in step S111. Third points of intersection between the lines and the model surface 106 are determined, and distances from the second dividing points 118 to the third intersecting points are determined in step S112. Each of the lines between the second dividing point 118 and the third intersecting point is divided into two equal segments, and a third dividing point is determined on each of the lines in step S113. Polygons are established on the third dividing points on the respective lines, providing a third layer (not shown) represented by those polygons, and a relaxation smoothing process is performed on the polygons of the third layer in step S114. Lines are established from the third dividing points to the model surface 106, and corresponding points 120 (see FIG. 7) as points of intersection between the lines and the model surface 106 are determined in step S115.

In step S116, the absolute values L of the distances between the corresponding points 120 and the respective measuring points 102 are determined. The positional relationship between the corresponding points 120 and the respective measuring points 102 is stored as representing polygons on the model surface in a given memory.

According to the stacking and deforming process, the corresponding points 120 are appropriately provided on the model surface 106 in association with the respective measuring points 102 of the polygonal surface 101. The measuring points 102 of the polygonal surface 101 are defined according to the information of the positional relationship representing the absolute values L of the distances (errors) from the corresponding points 120. The same number of polygons are constructed at the measuring points 102 and the corresponding points 120. The polygonal surface 101 is appropriately and easily corrected by being brought into close proximity with the model surface 106. In step S15, the corrected die model is produced.

Figure 8:
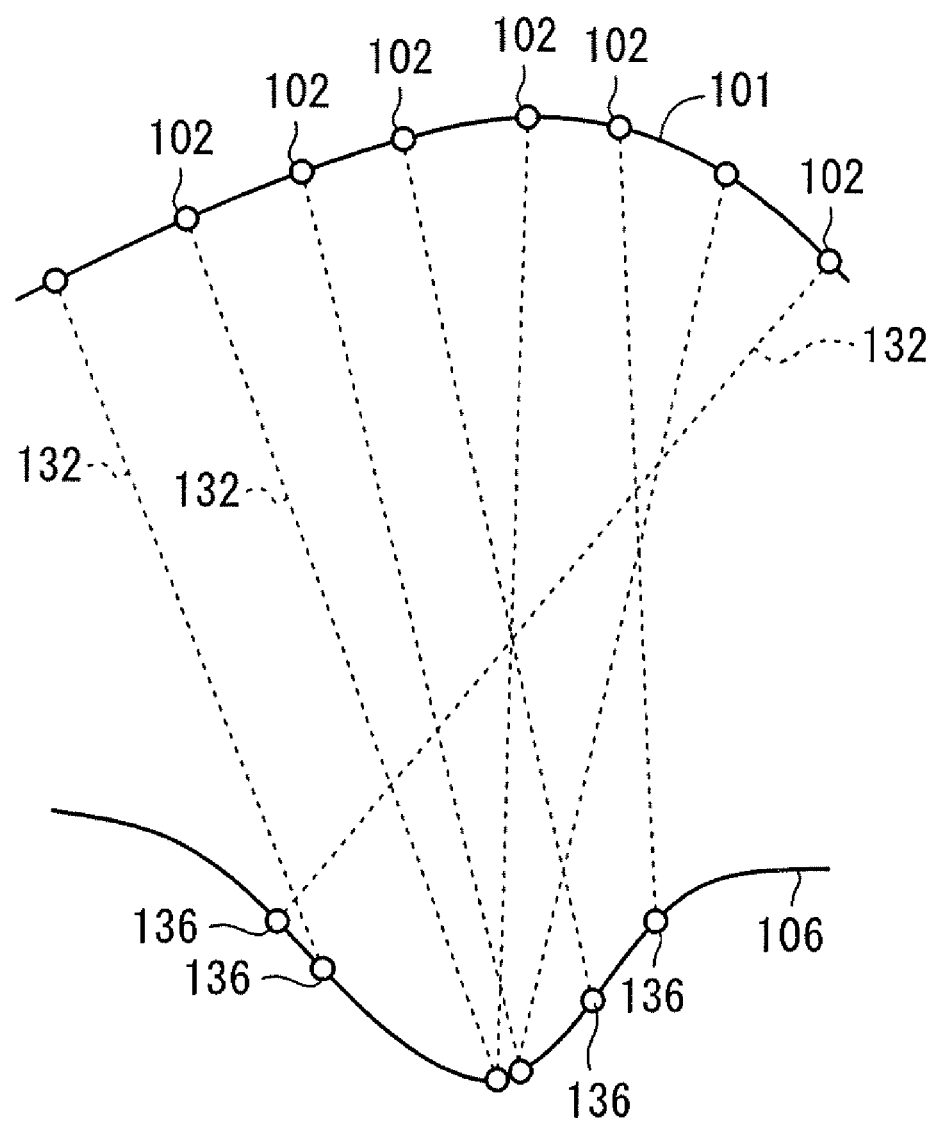
FIG. 8 is a diagram showing an example in which corresponding points and measuring points are in twisted association with each other.

If the stacking and deforming process is not performed, then, as shown in FIG. 8, in regions of the polygonal surface 101 or the model surface 106 where the radius of curvature is small, the relationship between the measuring points 102 and corresponding points 136 provided on the model surface 106 by straight lines 132 established from the measuring points 102 to the model surface 106 may be twisted, failing to establish an accurate corrected die model. According to the present embodiment, the stacking and deforming process is free of such a drawback, and establishes the corresponding points 120 on the model surface 106 while substantially keeping their positional relationship to the measuring points 102 on the polygonal surface 101, so that the corresponding points 120 and the measuring points 102 are appropriately associated with each other.

Figure 7:
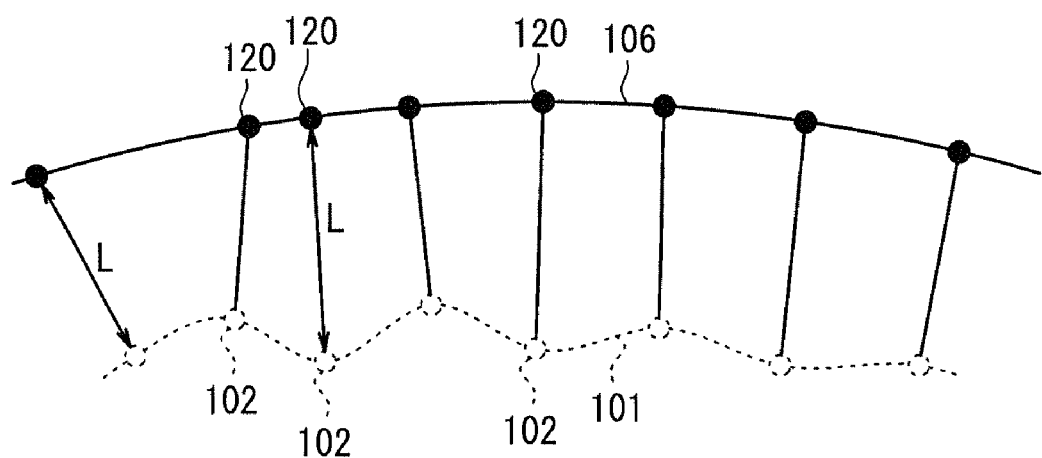
FIG. 7 is a diagram showing how corresponding points on the model surface and measuring points on the polygonal surface are associated with each other.

In FIGS. 5 through 7, the polygonal surface 101 is provided on only one side of the model surface 106. However, the polygonal surface 101 may be provided on the other side of the model surface 106, or may partly cross the model surface 106. In the above stacking and deforming process, intermediate surfaces in three layers are provided. However, two or four or more intermediate surfaces may be provided. The dividing ratio used as a basis for the dividing points to be determined during the stacking and deforming process may be set to any desired value. For example, a midpoint (1:1) may be set as a dividing point at all times.

The relaxation smoothing process will be described in detail below.

Figure 9:
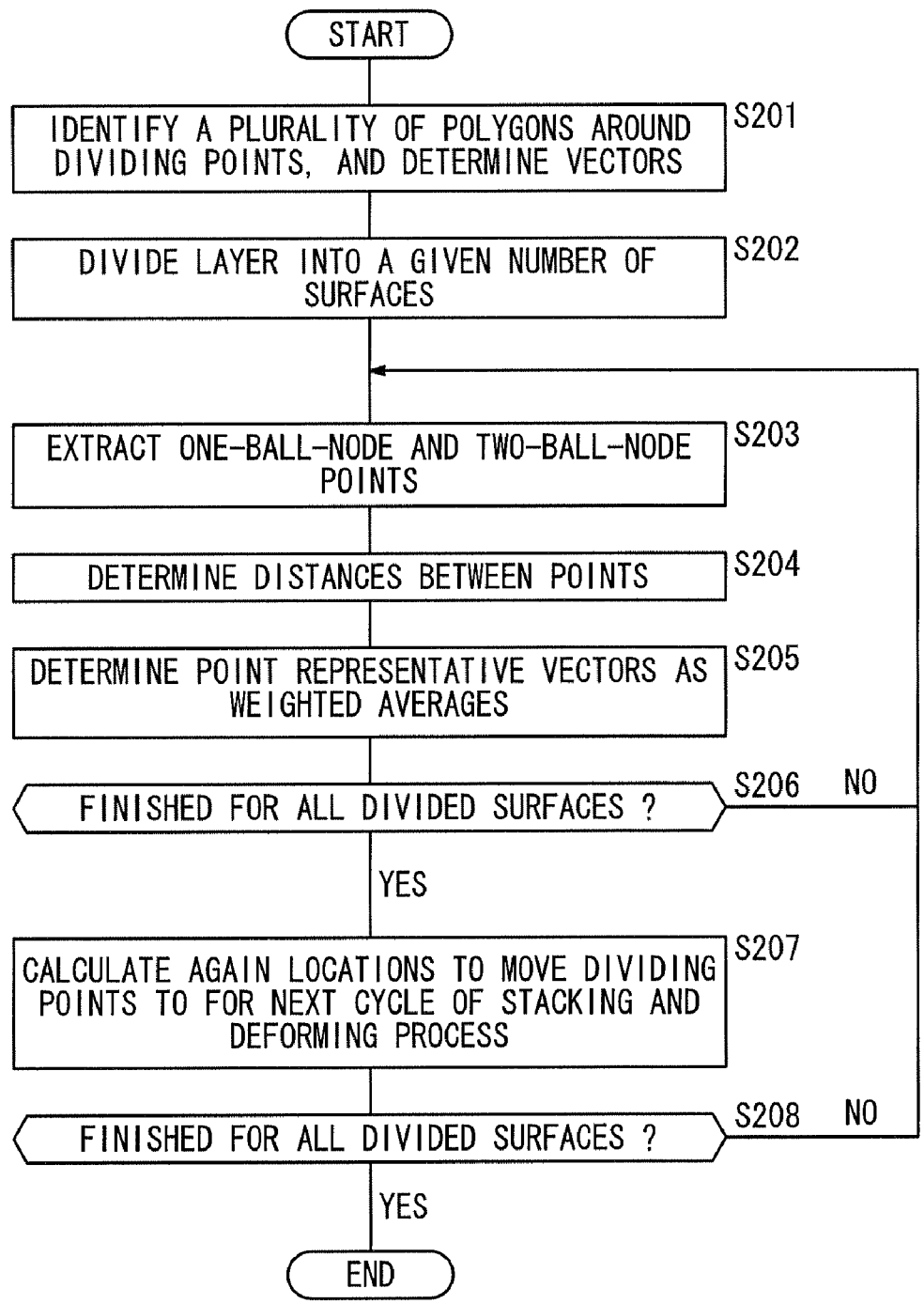
FIG. 9 is a flowchart of a processing sequence of a relaxation smoothing process.

In step S201 shown in FIG. 9, three-dimensional vectors 204 are determined as normal vectors to a given layer at dividing points 200.

Figure 10:
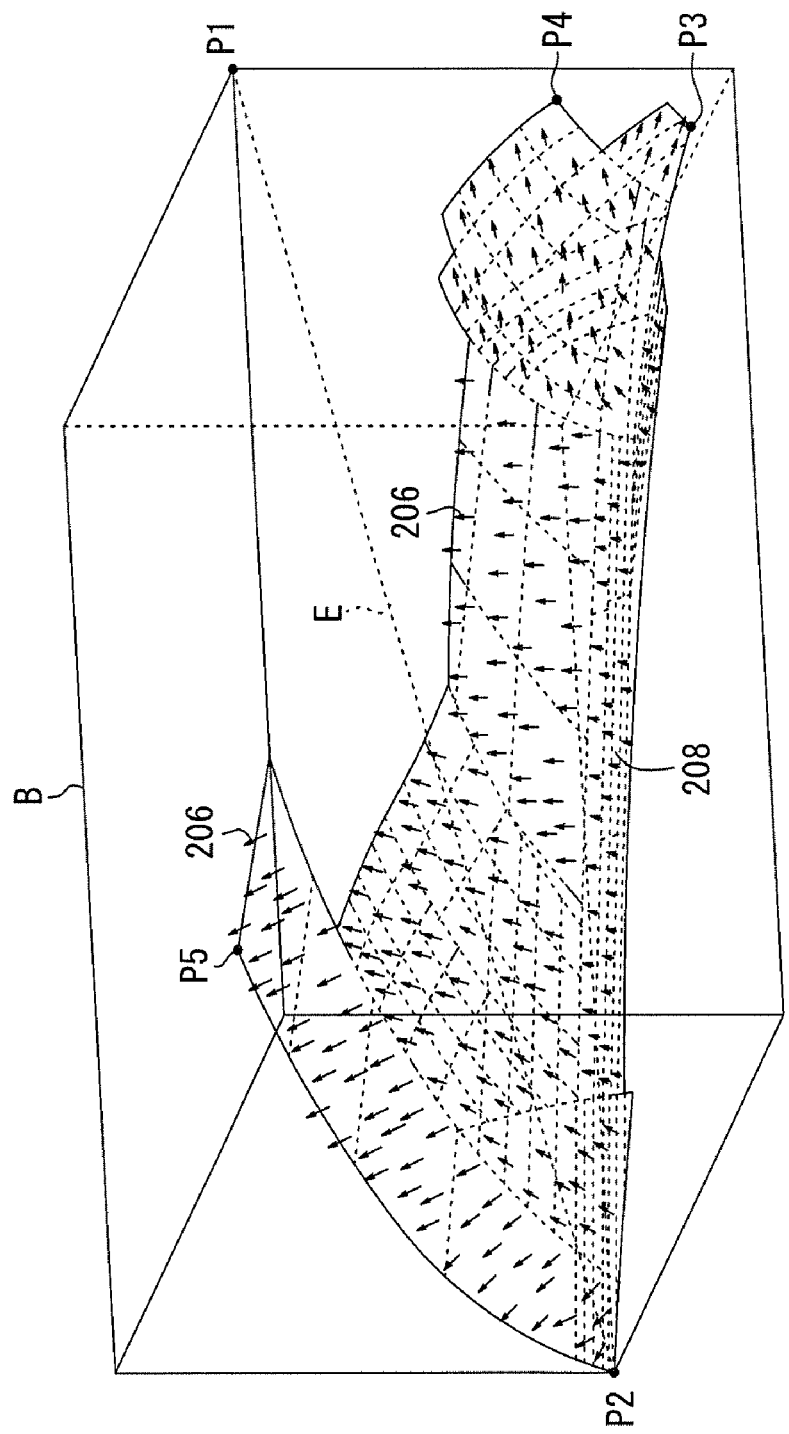
FIG. 10 is a diagram showing a process of determining surface representative vectors on divided surfaces.

In step S202, the layer to be processed is divided into a certain number of, e.g., ten, surfaces 208 (see FIG. 10).

Figure 11:
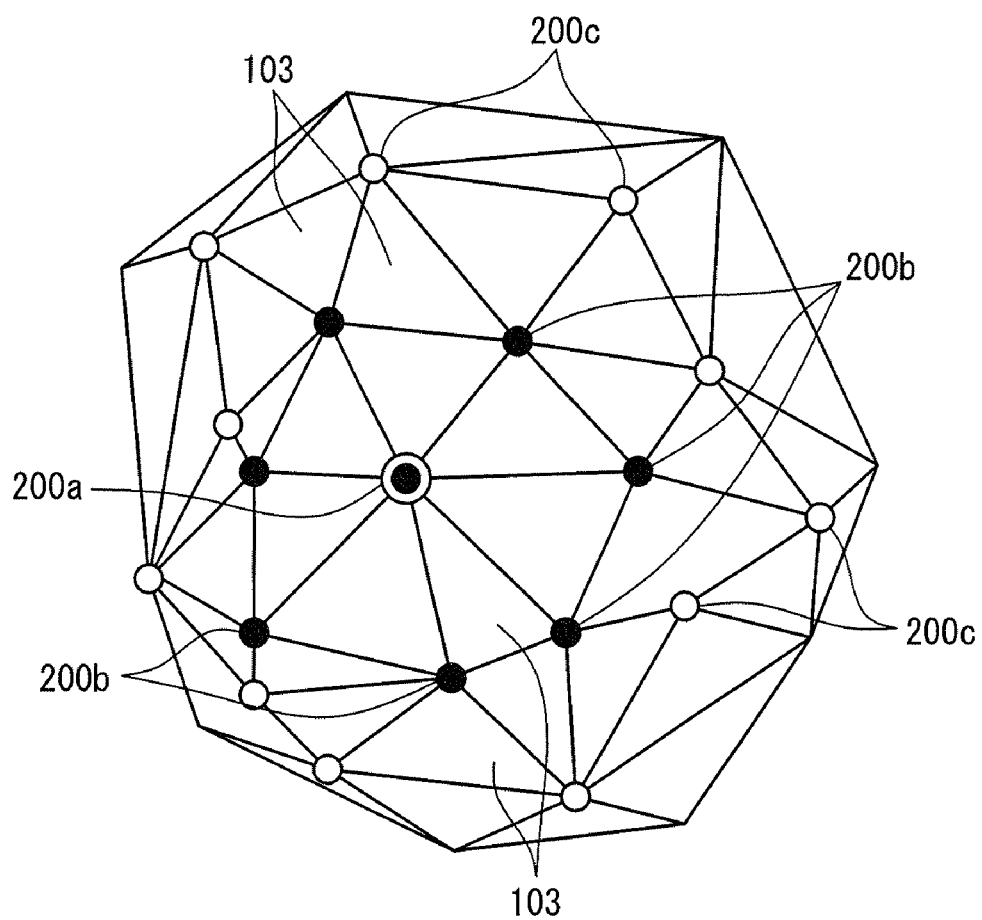
FIG. 11 is a diagram showing the manner in which points within two or less nodes from a given dividing point are extracted.

In step S203, as shown in FIG. 11, one-ball-node points 200b and two-ball-node points 200c are extracted with respect to a reference dividing point 200a. A one-ball node is a point connected to the dividing point 200a by a single line, and indicated as a black dot in FIG. 11. A two-ball node is a point connected to the dividing point 200a by two lines or less, and indicated as a white dot in FIG. 11. In FIG. 11, there are eight one-ball-node points 200b and eleven two-ball-node points 200c. Therefore, there are 19 one-ball-node and two-ball-node points.

In step S204, numbers j (j=1 through 19) are assigned to the one-ball-node and two-ball-node points, thereby making the corresponding point vectors 204 identifiable as points $n_j$, and linear distances $d_j$ from the dividing points 200a to the respective points $n_j$ are determined.

Figure 12:
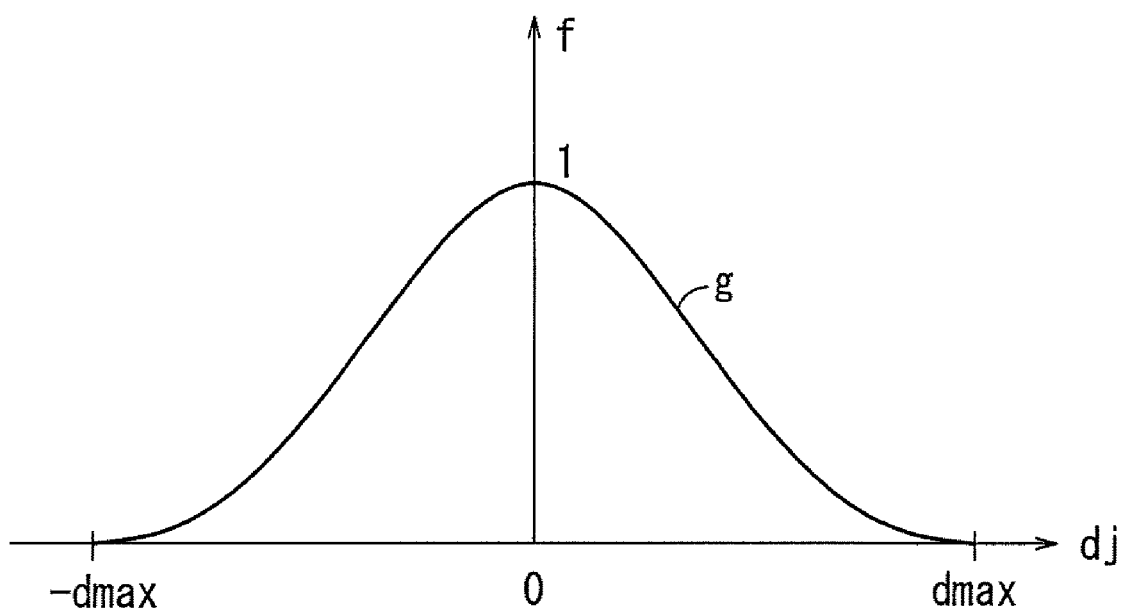
FIG. 12 is a diagram showing a weighting function.
Figure 13:
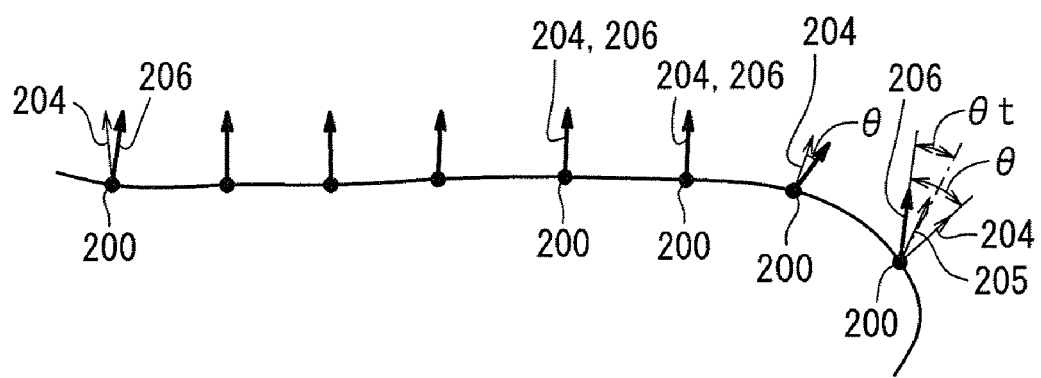
FIG. 13 is a diagram showing point representative vectors that are established and normal vectors.

In step S205, the vectors $n_j$ of the one-ball-node and two-ball-node points are weighted depending on the distances $d_j$ to determine point representative vectors $n'_j$ as weighted averages, according to the following equation (1):

$$n' = \frac{\sum_{j=0}^{m} n_j \cdot f(d_j(n_j))}{m} \quad (1)$$

where m is a parameter representing the total number of one-ball-node and two-ball-node points, i.e., m=19 in FIG. 11, and f is a weighting function having the distance $d_j$ as an argument, as shown in FIG. 12. If the absolute value of the distance $d_j$ is equal to or less than a threshold $d_{Max}$, then the function f is defined by a function g. If the absolute value of the distance $d_j$ is in excess of the threshold $d_{Max}$, then the function f is nil. The function g is a function representing a substantially normal distribution in the range of $0 \leq g \leq 1$. When $|d_j|=d_{Max}$, g=0, and when $d_j=0$, g=1. In FIG. 12, the positive and negative ranges of the distance $d_j$ represent face and back sides, respectively, of the surface being processed.

Of the point representative vectors n' determined according to the equation (1), those vectors of the points equal to or greater than three-ball-node points and those vectors corresponding to points whose distances $d_j$ are too large are excluded, and those vectors of the one-ball-node and two-ball-node points are weighted and averaged depending on the distances $d_j$. Therefore, vectors over smaller distances have a greater effect, providing point representative vectors n' representative of an appropriate peripheral shape. The point representative vectors $n'_j$ will hereinafter be denoted by the reference numeral 206.

As shown in FIG. 10, the threshold $d_{Max}$ may be determined by dividing a diagonal line E interconnecting diagonally opposite corners P1, P2 of a boundary box B by a divisor 10 according to $d_{Max} \leftarrow E/10$. Specifically, the boundary box B is defined as a rectangular parallelepiped including the measuring object, and the diagonal line E interconnecting the diagonally opposite corners P1, P2 of the boundary box B is divided into ten equal segments. The boundary box B is defined in contact with the maximum and minimum points of the surfaces 208 along three orthogonal axes. In FIG. 10, the point P2 serves as the minimum points along the three orthogonal axes and points P3, P4, P5 as the maximum points.

In step S206, it is confirmed whether point representative vectors 206 have been established for all the dividing points 200 on the layer being processed or not. If point representative vectors remain to be established, then control goes back to step S203, dividing points 200 for which point representative vectors need to be established are processed. If point representative vectors have been established for all the dividing points 200, then control goes to step S207.

In step S207, locations to move the dividing points 200 to for a next cycle of the stacking and deforming process is calculated again based on the point representative vectors 206.

If the angle θ between a vector 204 (e.g., the vector 204 on the right end in FIG. 13) and a point representative vector 206 obtained therefrom is greater than a threshold $θ_T$, then an average vector 205 between the vector 204 and the point representative vector 206 may be determined and used in the subsequent process.

In step S208, it is confirmed whether the dividing points 200 have been moved, corrected, and confirmed on all the divided surfaces 208 or not. If the dividing points 200 remain to be moved, corrected, and confirmed on a divided surface 208, then control goes back to step S203. If the dividing points 200 have been moved, corrected, and confirmed on all the divided surfaces 208, then the relaxation smoothing process shown in FIG. 9 is put to an end.

Figure 14:
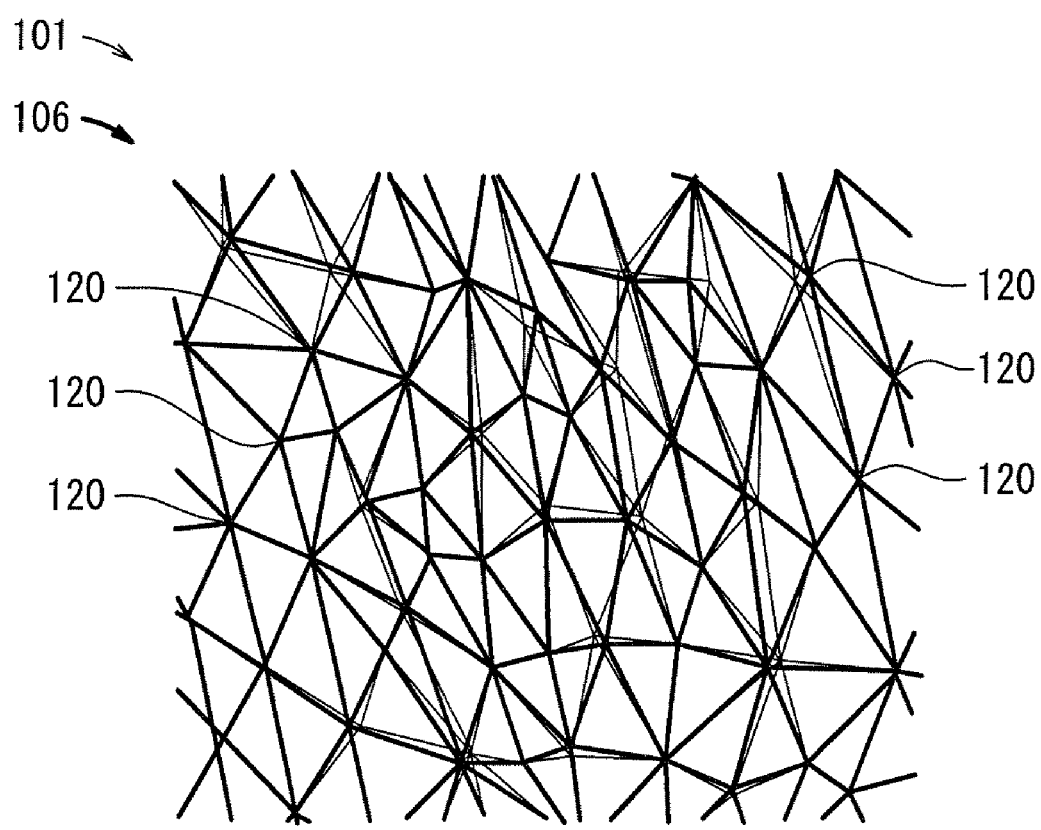
FIG. 14 is a diagram showing polygons established on a polygonal surface and polygons established on a model surface.

According to the above relaxation smoothing process, the shapes of the polygons of the original polygonal surface 101 as indicated by the thin lines in FIG. 14 are converted into the shapes of the polygons of the model surface 106 as indicated by the thick lines in FIG. 14 while their shapes are essentially kept during the stacking and deforming process. Therefore, the stacking and deforming process establishes the corresponding points 120 on the model surface 106 while substantially keeping their positional relationship to the measuring points 102 on the polygonal surface 101, so that the corresponding points 120 and the measuring points 102 are more appropriately associated with each other. In FIG. 14, the polygonal surface 101 and the model surface 106 are illustrated as being clearly distinguishable from each other for an easier understanding of their relationship. Actually, however, the difference between the polygonal surface 101 and the model surface 106 may be small. The number of measuring points 102 and the number of corresponding points 120 are equal to each other.

In the method of correcting die model data according to the present embodiment, as described above, measured three-dimensional die data and die model data are compared with each other, and the absolute values L of the distances between a plurality of pairs of measuring points 102 on a polygonal surface 101 and corresponding points 120 on a model surface 106, the polygonal surface 101 and the model surface 106 being established closely to each other. Thereafter, the die model data are corrected based on the absolute values L of the distances, producing a corrected die model. Therefore, the differences between the measuring points on the polygonal surface 101 and the corresponding points on the model surface 106 can easily be determined. The die model data can be corrected by the differences to produce a corrected die model as a repetitive die highly accurately within a short period of time.

The die model data can be corrected simply without the need for complex processes such as simulations, and the man-hours required to produce the repetitive die are reduced.

Figure 15:
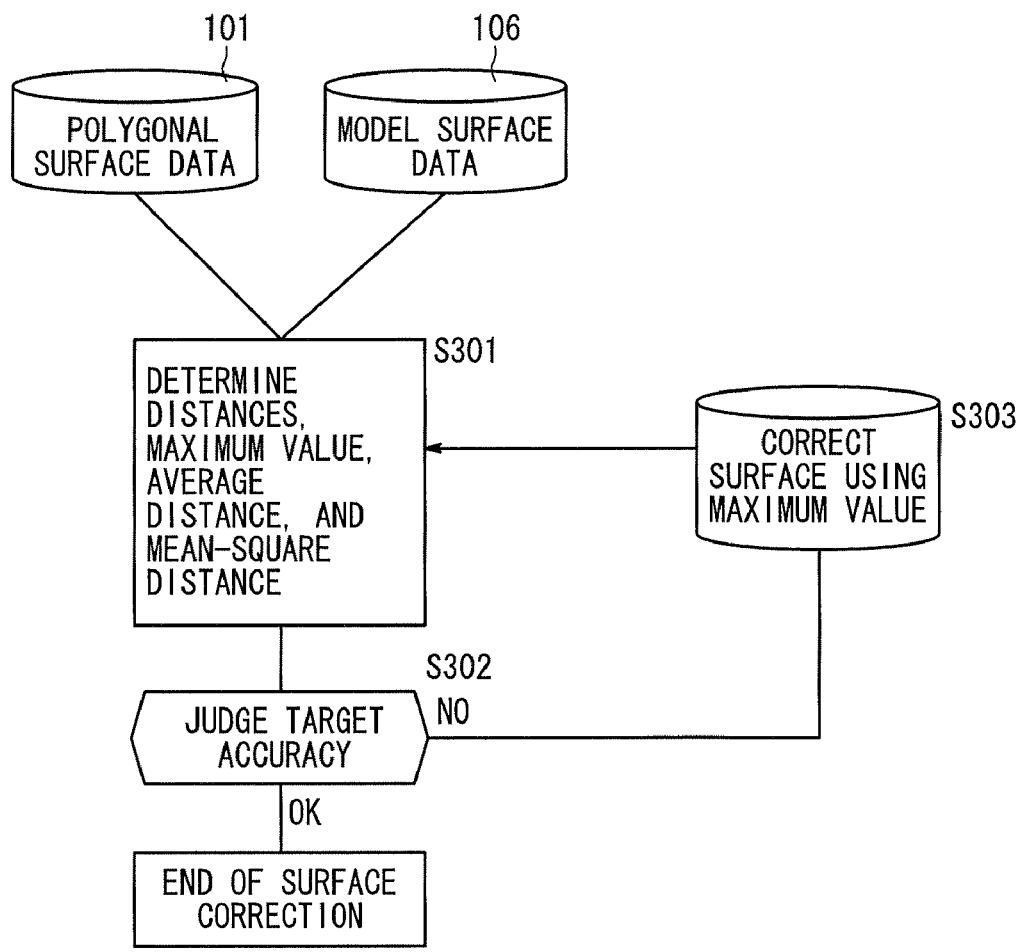
FIG. 15 is a flowchart of a processing sequence of an accuracy managing process.

For comparing the polygonal surface 101 and the model surface 106 with each other, as shown in FIG. 15, data of the polygonal surface 101 and the model surface 106 are read, and the absolute values L, a maximum value, an average distance, and a mean-square distance, of the distances between the corresponding points are determined (step S301).

Then, based on the absolute values L, it is determined whether a target accuracy has been reached or not (step S302). If the target accuracy has been reached, then the process shown in FIG. 15 is put to an end. If the target accuracy has not been reached, then points are successively added from a location corresponding to the maximum value, so as to deform the surface while referring to a given counter (step S303). Then, control returns to step S301.

Each time the surface is deformed, the distances L between the remaining points and the model data are measured. The process may be finished when the target accuracy is reached.

The method disclosed in Japanese Laid-Open Patent Publication No. 2006-234473 referred to above may be used to grasp how much the model surface 106 and the polygonal surface 101 are displaced from each other and which direction they are displaced from each other.

Specifically, the three-dimensional shapes of the forming surface of a die and die targets secured to the die, and the coordinate positions of the die targets in a measuring coordinate system are measured, and the three-dimensional shapes of the formed surface of a formed article placed on the die and article targets secured to the formed article, and the coordinate positions of the article targets in the measuring coordinate system are measured. Using the measured coordinate positions of the die targets and the measured coordinate positions of the article targets, the measured three-dimensional shape of the forming surface of the die and the measured three-dimensional shape of the formed surface of the formed article may be brought into positional alignment in the same coordinate system. According to this method, the differences between the model surface 106 and the polygonal surface 101 can be detected, and the die model data can be corrected by the differences to produce a corrected die model as a repetitive die highly accurately within a short period of time.

Although certain preferred embodiments of the present invention have been shown and described in detail, it should be understood that various changes and modifications may be made therein without departing from the scope of the appended claims.

What is claimed is:

1. A method of correcting die model data, comprising:
   a first step of producing die model data based on a formed article model with a computer;
   a second step of producing a die based on said die model data;
   a third step of correcting said die;
   a fourth step of measuring the corrected die to produce measured three-dimensional die data; and
   a fifth step of comparing said measured three-dimensional die data with said die model data with a computer, bringing a first surface represented by said measured three-dimensional die data into proximity to a second surface represented by said die model data, calculating absolute values of distances between a plurality of pairs of measuring points on said first surface and corresponding points on said second surface, and correcting said die model data based on the absolute values of the distances.

2. A method according to claim 1, wherein said fifth step comprises:
   a first auxiliary step of calculating points of intersection between said die model data and average normal vectors to a plurality of surfaces having the measuring points of said measured three-dimensional die data;
   a second auxiliary step of dividing straight lines extending from said measuring points to said points of intersection at a predetermined ratio, thereby establishing dividing points; and
   a third auxiliary step of calculating points of intersection between said die model data and normal vectors from said dividing points to said die model data;
   wherein said second auxiliary step and said third auxiliary step are carried out at least once, thereby defining the measuring points of said measured three-dimensional die data and the corresponding points of said die model data.

3. A method according to claim 2, wherein said second auxiliary step comprises establishing polygons based on said dividing points, determining point representative vectors based on normal vectors to the polygons which are present in a predetermined range from said dividing points, and moving corresponding dividing points based on said point representative vectors.

4. A method according to claim 3, wherein said point representative vectors are determined by weighting, depending on distances, the normal vectors to the polygons which are present in the predetermined range from said dividing points and averaging the weighted normal vectors.

5. A method according to claim 2, wherein said first surface is corrected into a smooth surface by interconnecting central points of surfaces of polygons provided by said measuring points.

* * * * *

UNITED STATES PATENT AND TRADEMARK OFFICE
CERTIFICATE OF CORRECTION

PATENT NO. : 7,809,455 B2
APPLICATION NO. : 11/972460
DATED : October 5, 2010
INVENTOR(S) : Yoshio Kanai et al.

It is certified that error appears in the above-identified patent and that said Letters Patent is hereby corrected as shown below:

IN THE CLAIMS:

Please replace claim 1 with the following claim 1:

--1. A method of correcting die model data, comprising:

a first step of producing data of a formed article;

a second step of producing die model data based on the data of the formed article with a computer;

a third step of producing numerical control (NC) data for a NC machine tool based on the die model data;

a fourth step of producing a die on said NC machine based on said NC data;

a fifth step of pressing a subsequent formed article with the die produced on the NC machine;

a sixth step of correcting said die produced on the NC machine;

a seventh step of measuring the corrected die to produce measured three-dimensional die data;

an eighth step of comparing said measured three-dimensional die data with said die model data with a computer, bringing a first surface represented by said measured three-dimensional die data into proximity to a second surface represented by said die model data, calculating absolute values of distances between a plurality of pairs of measuring points on said first surface and corresponding points on said second surface, and correcting said die model data based on the absolute values of the distances, wherein correcting of said die model data comprises:

cutting off range to be corrected; and performing mesh smoothing, stacking and deforming processes on said die model data.--

Signed and Sealed this
Fourteenth Day of August, 2012

David J. Kappos
*Director of the United States Patent and Trademark Office*